US006483391B1

(12) United States Patent
Magoon et al.

(10) Patent No.: US 6,483,391 B1
(45) Date of Patent: Nov. 19, 2002

(54) SYSTEM FOR CONTROLLING THE AMPLITUDE OF AN OSCILLATOR

(75) Inventors: Rahul Magoon, Irvine; Alyosha C. Molnar, Costa Mesa; Jeff Zachan, Irvine, all of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/823,285

(22) Filed: Mar. 30, 2001

(51) Int. Cl.[7] .................................................. H03L 5/00
(52) U.S. Cl. ........................................ 331/183; 331/182
(58) Field of Search ................................ 331/109, 175, 331/179, 182, 183, 185, 186

(56) References Cited

U.S. PATENT DOCUMENTS

| 3,848,185 | A | * | 11/1974 | Hentschel | .................. | 324/57 R |
|---|---|---|---|---|---|---|
| 4,322,819 | A | | 3/1982 | Hyatt | ........................... | 365/45 |
| 4,445,189 | A | | 4/1984 | Hyatt | ........................ | 364/600 |
| 4,494,080 | A | | 1/1985 | Call | ............................. | 331/8 |
| 4,527,116 | A | | 7/1985 | Sorba et al. | ................... | 324/77 |
| 4,910,706 | A | | 3/1990 | Hyatt | ........................... | 365/45 |
| 5,339,275 | A | | 8/1994 | Hyatt | ........................... | 365/45 |
| 5,603,097 | A | | 2/1997 | Kanou | ......................... | 455/76 |
| 5,663,690 | A | | 9/1997 | McGinn | ..................... | 331/109 |
| 5,764,109 | A | | 6/1998 | Kukkonen | ................... | 331/44 |
| 5,809,207 | A | | 9/1998 | Miyagi et al. | ............. | 386/116 |
| 5,857,003 | A | | 1/1999 | Geiger et al. | ............... | 375/319 |
| 5,907,261 | A | | 5/1999 | Jones | ........................ | 330/254 |
| 6,002,300 | A | | 12/1999 | Herbster et al. | ............ | 330/149 |
| 6,008,693 | A | | 12/1999 | Marchok et al. | ............ | 370/210 |
| 6,194,963 | B1 | | 2/2001 | Camp, Jr. et al. | ........... | 330/149 |
| 6,268,777 | B1 | | 7/2001 | Welch | ........................ | 331/117 |
| 6,278,332 | B1 | | 8/2001 | Nelson et al. | ................. | 331/17 |
| 6,316,994 | B1 | | 11/2001 | Frecassetti et al. | ......... | 330/149 |
| 6,370,433 | B1 | | 4/2002 | Hartlaub et al. | .............. | 607/32 |

OTHER PUBLICATIONS

Osa, Juan I., Carlosena, Alfonso; "Mosfet–C Sinusoidal Oscillator with Variable Frequency and Amplitude," Iscas 2000 –*IEEE International Symposium on Circuit and Sytems*, May 28–31, Genevea, Switzerland *pp. 725–728.

(List continued on next page.)

*Primary Examiner*—David Mis
(74) *Attorney, Agent, or Firm*—Thomas, Kayden, Horstemeyer & Risley, LLP

(57) ABSTRACT

Systems for controlling the amplitude of the output signal of a controllable oscillator in a frequency synthesizer are provided. One such system provides a circuit having a controllable oscillator and an amplitude control circuit. The controllable oscillator is configured to generate an output signal having a predefined frequency and a predefined amplitude. The controllable oscillator is also configured with a plurality of operational states that are controlled by the amplitude control circuit. Each operational state of the controllable oscillator defines a particular current bias associated with a distinct amplitude of the output signal of the controllable oscillator. The amplitude control circuit receives the output signal of the controllable oscillator and determines the amplitude. When the amplitude of the output signal of the controllable oscillator is less than the predefined amplitude, the amplitude control circuit provides a control signal to the controllable oscillator. The control signal is configured to change the controllable oscillator to the operational state corresponding to the distinct amplitude that best approximates the predefined amplitude.

31 Claims, 11 Drawing Sheets

OTHER PUBLICATIONS

Zanchi, A., Bonfanti, A., Levantino, S., Samori, C. and Lacaita, A.L.; "Automatic Amplitude Control Looop for a 2–V, 2.5–GHz LC–tank VCO, " *IEEE 2001 Custom Integrated Circuits Conference*. *pp. 209–212.

Zanchi, Alfio, Samori, Carlo, Levantinon, Salvatore, Lacaita, Andrea L.; "A 2–V 2.5–GHz –104–dBc/Hz at 100 kHz Fully Integrated VCO with Wide–Band Low–Noise Automatic Amplitude Control Loop," *IEEE* 2001. *Jossc* vol. 36 No. 4 4/4/1 pp. 611–618.

Filanovsky, I.M.; "A Sinusoidal VCO with Control of Freuency and Amplitude," University of Alberta, Edmonton, Alberta, Canada, T6G 2E1. IEEE 1990 pp. 446–449.

Margarit, Mihai, A., Tham, Joo Leong, Meyere, Robert G., and Deen Jamal M.; "A Low–Noise, Low–Power VCO with Automatic Amplitude Control for Wireless Applications," IEEE 1999. Jossc vol. 34 No. 6 Jun. 1999 pp. 761–771.

* cited by examiner

SYSTEM FOR CONTROLLING THE AMPLITUDE OF AN OSCILLATOR

BACKGROUND OF THE INVENTION

1. Field of the Invention

The invention is generally related to frequency synthesizers, and more particularly, is related to systems and methods for controlling the amplitude of an oscillator.

2. Related Art

Frequency synthesizers are regularly employed in communication transceivers used in numerous types of communication systems and communication technologies, such as, radio frequency communication systems. Typically, such frequency synthesizers use a phase-locked loop to precisely control the frequency of the output signal of a voltage-controlled oscillator (VCO). The frequency synthesizer typically consists of a VCO, a low pass filter, and a phase-locked loop. The VCO generates an output signal having a particular frequency. A phase detector in the phase-locked loop receives the output signal and compares the output signal to a reference frequency. Based on the comparison of the output signal to the reference frequency, the phase-locked loop generates a control signal that is provided to the low pass filter and then to the VCO. The control signal is typically received by a variable capacitor, referred to as a varactor, in the VCO. The control signal tunes the variable capacitor, thereby changing the frequency of the output signal of the VCO.

Generally, such frequency synthesizers are effective where the range of the frequency of the output signal is limited. However, in situations where the frequency of the output signal of the VCO needs to be varied over a broad frequency range, such frequency synthesizers are very problematic. For example, where frequency synthesizers are used in wireless broadband and wire-line broadband communication systems, or in multi-band devices and multi-mode devices, the limited tuning range of the varactors prevents effective tuning of the VCO and, therefore, effective channel selection. The limited tuning range of the varactors may also be problematic in situations where large fabrication process variations, temperature variations, or other variations require the output of the controllable oscillator to be varied over a broad frequency range. Additionally, varactors with a wide-tuning range are also problematic due to the fact that they are extremely sensitive to noise and interference on the control lines from the phase-locked loop. Furthermore, the non-linear characteristics of wide-tuning varactors are also problematic in the design of the loop filter in the frequency synthesizer.

Prior art frequency synthesizers are also limited in their ability to effectively control the amplitude of the output signal of the VCO as the frequency is changed. As known in the art, due to interactions between amplitude and frequency, it is desirable to maintain a constant amplitude over the entire frequency range of the VCO. Prior art frequency synthesizers include a peak detector, a low pass filter, an amplifier, and a noise filter. The peak detector is used to determine the amplitude of the output signal of the VCO and generate a control signal. The control signal is filtered by the low pass filter and amplified by the amplifier. The filtered and amplified signal is received by the noise filter. The noise filter is needed to reject bias noise before providing the resulting signal to the VCO. The VCO uses the resulting signal to change the bias current, and thereby control the amplitude of the output signal. However, such amplitude control methods are extremely slow and unstable. The noise filter is essentially an RC circuit. Because the control signal for changing the amplitude passes through the capacitor, there is significant delay in controlling the amplitude. Thus, there is a need in the industry to address these deficiencies and inadequacies.

SUMMARY

The invention provides a system for controlling the amplitude of the output signal of a controllable oscillator in a frequency synthesizer. The invention provides a circuit having a controllable oscillator and an amplitude control circuit. The controllable oscillator is configured to generate an output signal having a predefined frequency and a predefined amplitude. The controllable oscillator is also configured with a plurality of operational states that are controlled by the amplitude control circuit. Each operational state of the controllable oscillator defines a particular current bias associated with a distinct amplitude of the output signal of the controllable oscillator. The amplitude control circuit receives the output signal of the controllable oscillator and determines the amplitude. When the amplitude of the output signal of the controllable oscillator is less than the predefined amplitude, the amplitude control circuit provides a control signal to the controllable oscillator. The control signal is configured to change the controllable oscillator to the operational state corresponding to the distinct amplitude that best approximates the predefined amplitude.

The invention also provides related methods of operation and computer readable media. Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

System Overview

Figure 1:
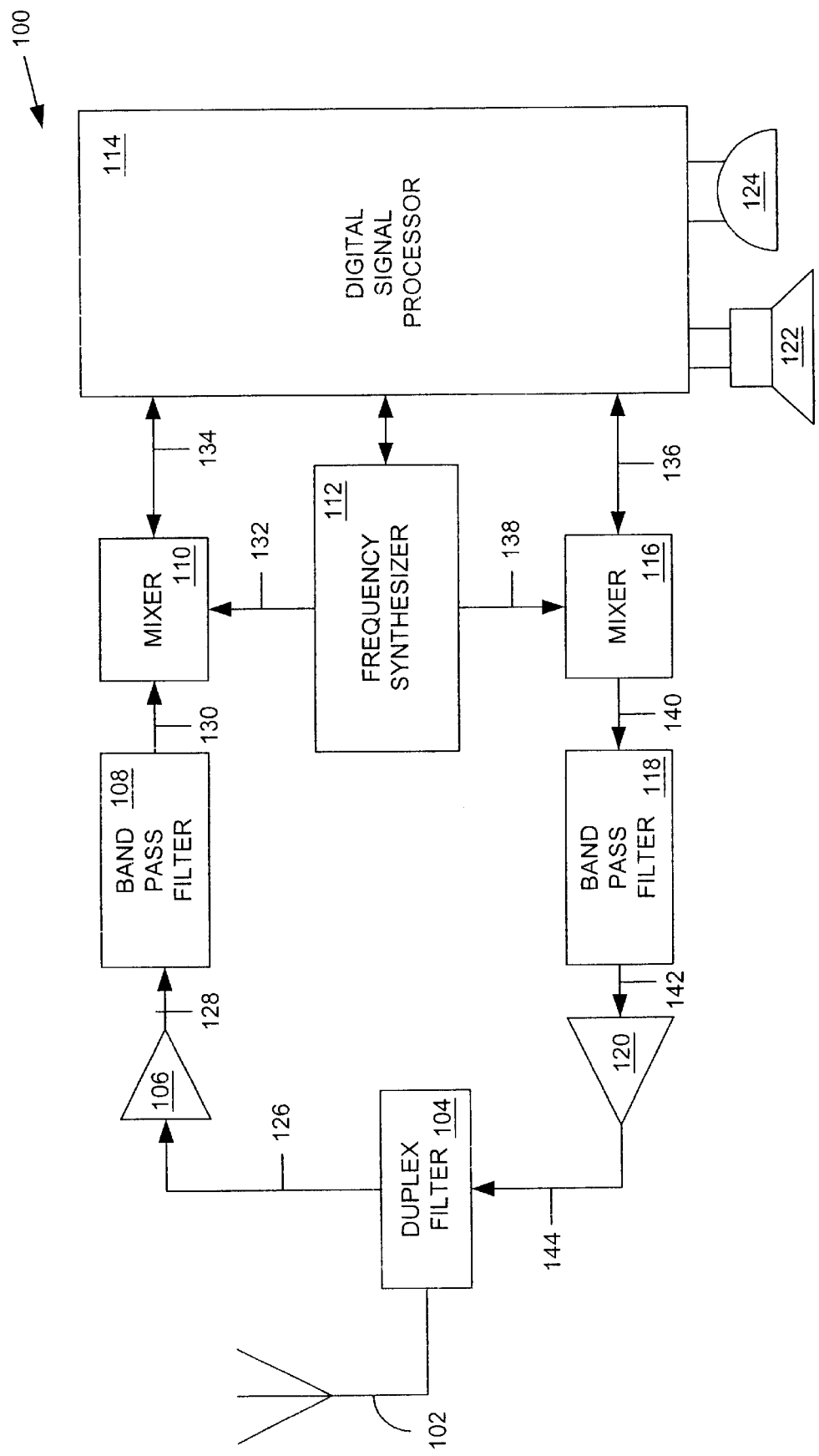
FIG. 1 illustrates a block diagram of a communication device in which the systems and methods of the present invention may be implemented.

FIG. 1 illustrates a block diagram of a communication device 100 in which a frequency synthesizer 112 according to the systems and methods of the present invention may be implemented. Communication device 100 may be used for communication with any of a number of communication systems, such as, for example, wireless communication systems, fiber optic communication systems, any other known or future broadband communication system, or any other type of communication system. In situations where communication device 100 is a wireless device, communication device 100 may communicate with any of a number of wireless communication systems, which may be based on any of the following technologies: analog advanced mobile phone service (AMPS), global system for mobile communications (GSM), digital advanced mobile phone service (D-AMPS), Japanese mobile communication systems (MCS), Scandinavian nordic mobile telephone (system) (NMT), British total access communication system (TACS). Furthermore, various modulation and access methodologies may be used, such as, for example, code division multiple access (CDMA), including CDMA2000, time division multiple access (TDMA), wideband CDMA (WCDMA), personal communication networks (PCN), Integrated Dispatch Enhanced Networks (iDEN), personal communications service (PCS), cellular digital packet data (CDPD), general packet radio service (GPRS), wireless access protocol (WAP) systems, specialized mobile radio (SMR), second generation (2G) systems, third generation (3G) systems, or similar predecessor or successor systems, or any other radio communication system supporting voice and/or data communications. Communication device 100 may also be a multi-band communication device capable of communicating with multiple wireless communication systems.

Communication device 100 comprises an antenna 102, a duplex filter 104, a low noise amplifier 106, a band pass filter 108, a receive mixer 110, a frequency synthesizer 112, a processor 114, a transmit mixer 116, a band pass filter 118, a power amplifier 120, a speaker 122, and a microphone 124. Examples of commercially available processors include, but are not limited to, an ARM processor such as an ARM 7 or ARM 9 processor, a ZSP Core supplied by LSI Logic or a Teak processor supplied by DSP Group. As known in the art, communication device 100 may include any of a number of other components. For example, communication device 100 may include a memory module, such as, random access memory (RAM), flash memory, non-volatile RAM (NVRAM), or any other known type of memory device. Communication device 100 may also include a user interface for performing a number of functions typically implemented with various types of communication devices, such as, for example, cellular telephones, personal digital assistants (PDAs), pagers, or any other desirable functionality.

In operation, communication device 100 receives and transmits broadband signals, such as, for example, radio frequency signals, from and to the communication system via antenna 102. In the receive direction, from the communication system to communication device 100, a broadband signal received by communication device 100 via antenna 102 is communicated to duplex filter 104. Duplex filter 104 receives signals from the communication system and communicates them via connection 126 to amplifier 106. Amplifier 106 provides an amplified signal to band pass filter 108 via connection 128. Band pass filter 108 passes frequencies within the range of frequencies associated with the communication systems with which communication device 100 communicates to mixer 110 via connection 130. Frequencies outside this range are attenuated. Mixer 110 receives a signal from frequency synthesizer 112 via connection 132, mixes it with the signal received via connection 130, and provides a signal to processor 114 via connection 134. Processor 114 processes the signal received via connection 134 and, where the signal is an audio signal, may provide the resulting signal to speaker 122. In other embodiments where communication device 100 supports data communications, processor 114 may provide a data signal to a user interface, such as, for example, a liquid crystal display or other display device.

Although processor 114 is represented as a single element in FIG. 1, as known in the art, processor 114 may, for example, comprise a baseband processor, an integrated analog (IA) integrated circuit (IC), and a power management IC (PMIC). The baseband processor manages all communication and user interface functions. The baseband processor may be integrated on a single die and may be housed in a number of ways, such as, in a 128-pin thin quad flat pack (TQFP) or a 160-pin 12×12 mm chip array ball grid array (CABGA). The IAIC implements all signal conversion functions required by communication device 100. The IAIC may be a highly integrated mixed signal device that also manages all timing and interfacing between the baseband processor and the other components of communication device 100. IAIC may be housed in, for example, a 100-pin TQFP or a 100-pin 10×10 mm CABGA. The PMIC implements all power supply functions. The PMIC may also support subscriber identity modules (SIMs), and through the use of programmable switching regulators, the PMIC may be independent of battery chemistry. The PMIC may be housed in, for example, a 48-pin TQFP.

In the transmit direction, from communication device 100 to the communication system, voice signals originating from microphone 124 are processed by processor 114 and provided to mixer 116 via connection 136. As described above, communication device 100 may support data communication, in which case processor 114 processes the data signal and provides the resulting signal to mixer 116. Mixer 116 receives a signal from frequency synthesizer 112 via connection 138, mixes it with the signal received via connection 136 from processor 114, and provides a signal to band pass filter 118 via connection 140. Similar to band pass filter 108, filter 118 provides frequencies within the range of frequencies associated with the communication systems with which communication device 100 communicates to amplifier 120 via connection 142. Frequencies outside this range are attenuated. The amplified signal is provided to duplex filter 104 via connection 144, and then provided to the communication system via antenna 102.

Frequency Control Circuit

Figure 2:
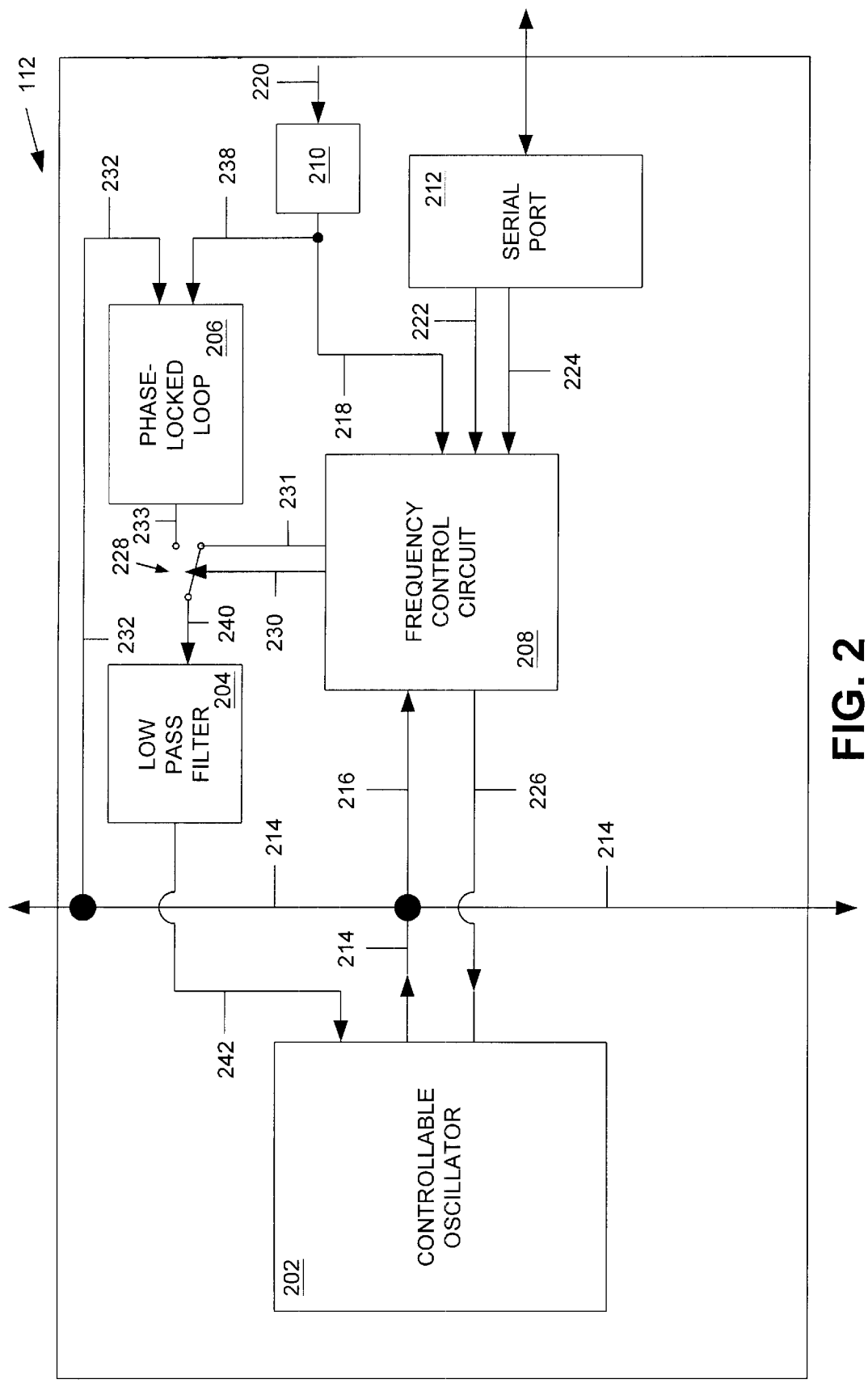
FIG. 2 is a block diagram of one of a number of embodiments of the frequency synthesizer of FIG. 1.

FIG. 2 illustrates a block diagram of one of a number of embodiments of frequency synthesizer 112 of FIG. 1. Frequency synthesizer 112 may comprise a controllable oscillator 202, a low pass filter 204, a phase-locked loop 206, a frequency control circuit 208, an R-divider circuit 210, and a serial port 212.

Frequency synthesizer 112 may be implemented in hardware, software, firmware, or a combination thereof. In certain embodiments, frequency synthesizer 112 may be implemented in software or firmware that is stored in memory and that is executed by a processor or any other suitable instruction execution system. Where implemented in hardware, as in certain other embodiments, frequency synthesizer 112 may be implemented with any or a combination of the following technologies, which are all well known in the art: a discrete logic circuit(s) having logic gates for implementing logic functions upon data signals, an application specific integrated circuit (ASIC) having appropriate combinational logic gates, a programmable gate array (s) (PGA), a field programmable gate array (FPGA), etc.

Controllable oscillator 202 may be a voltage controlled oscillator (VCO). In alternative embodiments, controllable oscillator 202 may be any type of oscillator and need not be voltage controlled. As described in detail below, the important aspects of frequency synthesizer 112 are that controllable oscillator 202 is configured to have a plurality of operational states in which each of the operational states correspond to a distinct frequency for the output signal of controllable oscillator 202 and that the operational state of controllable oscillator 202 is responsive to control signals received from phase-locked loop 206 and frequency control circuit 208.

Phase-locked loop 206 may be a typical phase-locked loop as known in the art, such as those described by Bezhad Razavi in "Monolothic Phase-Locked Loops and Clock Recovery Circuits," IEEE Press, 1996, which is hereby incorporated in its entirety by reference. For example, as described below, phase-locked loop 206 may comprise a phase detector and a plurality of charge pumps, or current sources.

In the operation of frequency synthesizer 112, controllable oscillator 202 generates an output signal on connection 214. As described above, the output signal of controllable oscillator 202 may be provided to mixer 110 via connection 132 and to mixer 116 via connection 138 (FIG. 1). The frequency of the output signal of controllable oscillator 202 may be controlled by frequency control circuit 208 and phase-locked loop 206. In certain embodiments of frequency synthesizer 112, the frequency of the output signal of controllable oscillator 202 is controlled first by frequency control circuit 208 and then by phase-locked loop 206.

As described above, controllable oscillator 202 may be configured to have a plurality of operational states in which each of the operational states corresponds to a distinct frequency for the output signal of the controllable oscillator. The frequency of the output signal of controllable oscillator 202 may be controlled by changing the operational state of controllable oscillator 202 and thereby changing the corresponding distinct frequency for the output signal.

Figure 3:
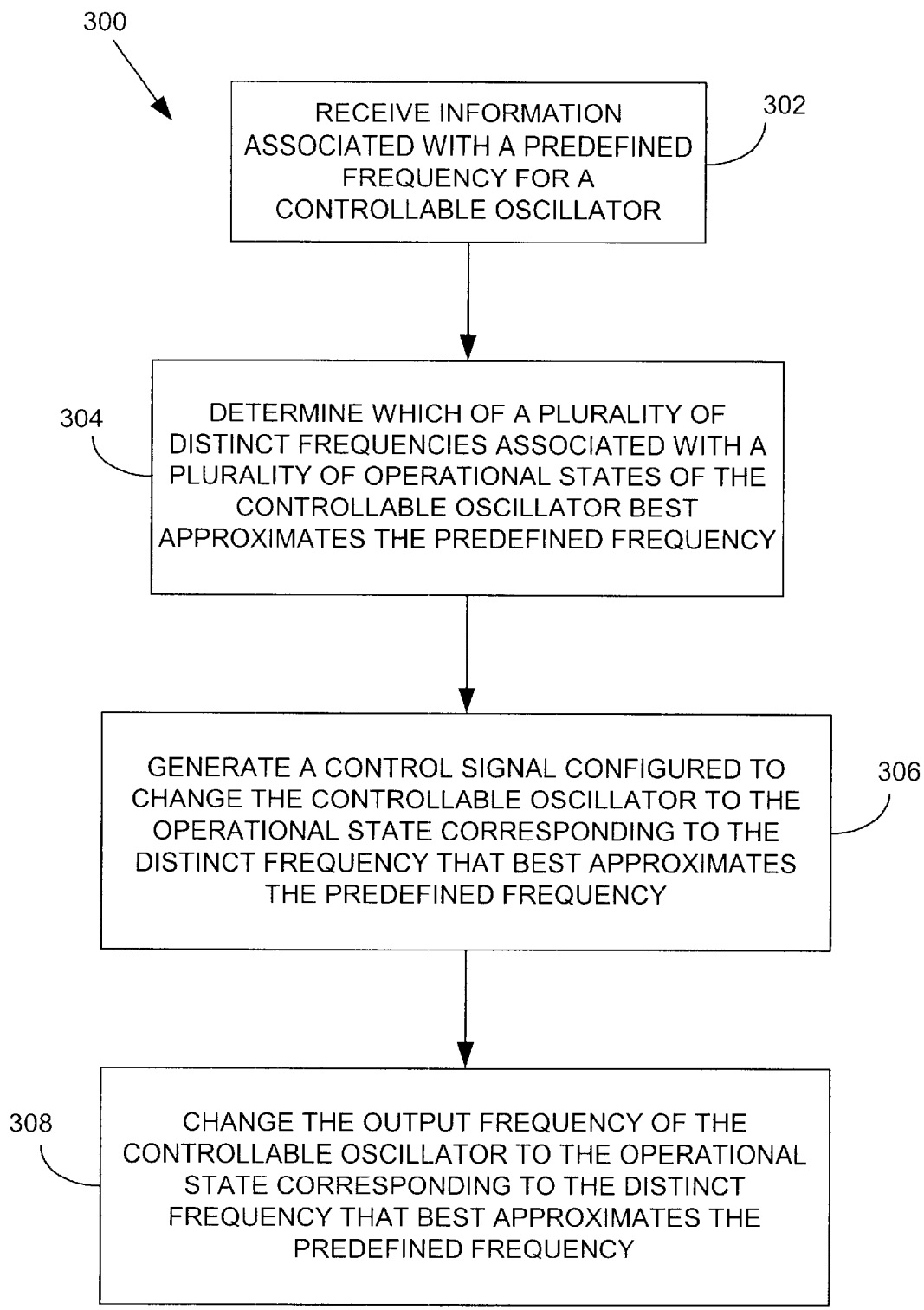
FIG. 3 is a flow chart illustrating the architecture and operation of one of a number of embodiments of the frequency control circuit of FIG. 2 for controlling the frequency of the output signal of the controllable oscillator.

FIG. 3 is a flow chart 300 illustrating the architecture and operation of one of a number of embodiments of frequency control circuit 208 of FIG. 2 for controlling the frequency of the output signal of controllable oscillator 202. At block 302, frequency control circuit 208 receives information associated with a predefined frequency, or reference frequency, for the output signal of controllable oscillator 202. The information associated with the predefined frequency may be received as a signal provided on connection 218 from R-divider circuit 210. R-divider circuit 210 may generate the information associated with the predefined frequency for the output frequency of controllable oscillator 202 based on a system clock signal received on connection 220. In alternative embodiments, frequency control circuit 208 may also receive information associated with the predefined frequency from serial port 212 on connections 222 and 224.

At block 304, frequency control circuit 208 determines which of the plurality of distinct frequencies associated with the plurality of operational states of controllable oscillator 202 best approximates the predefined frequency. Frequency control circuit 208 receives the output signal of controllable oscillator 202 on connections 214 and 216. At block 306, frequency control circuit 208 generates a control signal configured to change the frequency of the output signal of controllable oscillator 202 to the operational state corresponding to the distinct frequency that best approximates the predefined frequency. Frequency control circuit 208 may provide the control signal to controllable oscillator 202 on connection 226. At block 308, in response to the control signal from frequency control circuit 208, controllable oscillator 202 may be changed to the operational state corresponding to the distinct frequency that best approximates the predefined frequency.

After the frequency of the output signal of controllable oscillator 202 has been changed to the operational state corresponding to the distinct frequency that best approximates the predefined frequency, the frequency of the output signal of controllable oscillator 202 may be further controlled by phase-locked loop 206. In this manner, frequency control circuit 208 may perform a less accurate approximation of the predefined frequency, but one which is much faster, for example, than phase-locked loop 206, over a wider range of frequencies. Then, phase-locked loop 206 may be used to perform a much more precise approximation of the predefined frequency.

Frequency control circuit 208 may enable phase-locked loop 206 to begin controlling the frequency of the output signal of controllable oscillator 202 by, for example, engaging switch 228 in response to a switch control signal supplied on connection 230. Switch 228 and the switch control signal may be configured so that when phase-locked loop 206 controls controllable oscillator 202, switch 228 connects connection 233 and connection 240, and when frequency control circuit 208 controls controllable oscillator 202, switch 228 connects connection 240 and connection 231. Furthermore, when frequency control circuit 208 is engaged, a control signal may be provided to low pass filter 204 on connection 231. The control signal on connection 231 may be configured to disengage the controlling mechanism within controllable oscillator 202 that is engaged by phase-locked loop 206 while controlling the frequency of controllable oscillator 202. For example, where controllable oscillator 202 is voltage-controlled by phase-locked loop 206 through a variable capacitor, frequency control circuit 208 may be configured to provide a constant voltage on connection 231 in order to keep the variable capacitor set to a constant value while frequency control circuit 208 is engaged.

When engaged by frequency control circuit 208, phase-locked loop 206 may control the frequency of the output signal of controllable oscillator 202 as known in the art and described by Bezhad Razavi in "Monolothic Phase-Locked Loops and Recovery Circuits." For example, phase-locked loop 206 receives the output signal of controllable oscillator 202 on connection 232 and the reference frequency on connection 238. Based on the output signal and the reference frequency, phase-locked loop 206 generates a control signal and provides the control signal to low pass filter 204 on connection 240. The filtered control signal is provided to controllable oscillator 202 on connection 242. In response to the control signal on connection 242, a variable capacitor (not shown in FIG. 2) in controllable oscillator 202 may be engaged. The control signal and the variable capacitor may be configured to control to the frequency of the output signal of controllable oscillator 202 on connection 214.

It should be understood that there are numerous embodiments for frequency synthesizer 112. For example, the frequency of the output signal of controllable oscillator 202 may be controlled first by frequency control circuit 208 and then by phase-locked loop 206. However, in other embodiments of frequency synthesizer 112, the frequency of the output signal of controllable oscillator 202 may be controlled first by phase-locked loop 206 and then by frequency control circuit 208. In still other embodiments of frequency synthesizer 112, the frequency of the output signal of controllable oscillator 202 may be controlled entirely by frequency control circuit 208.

Figure 4:
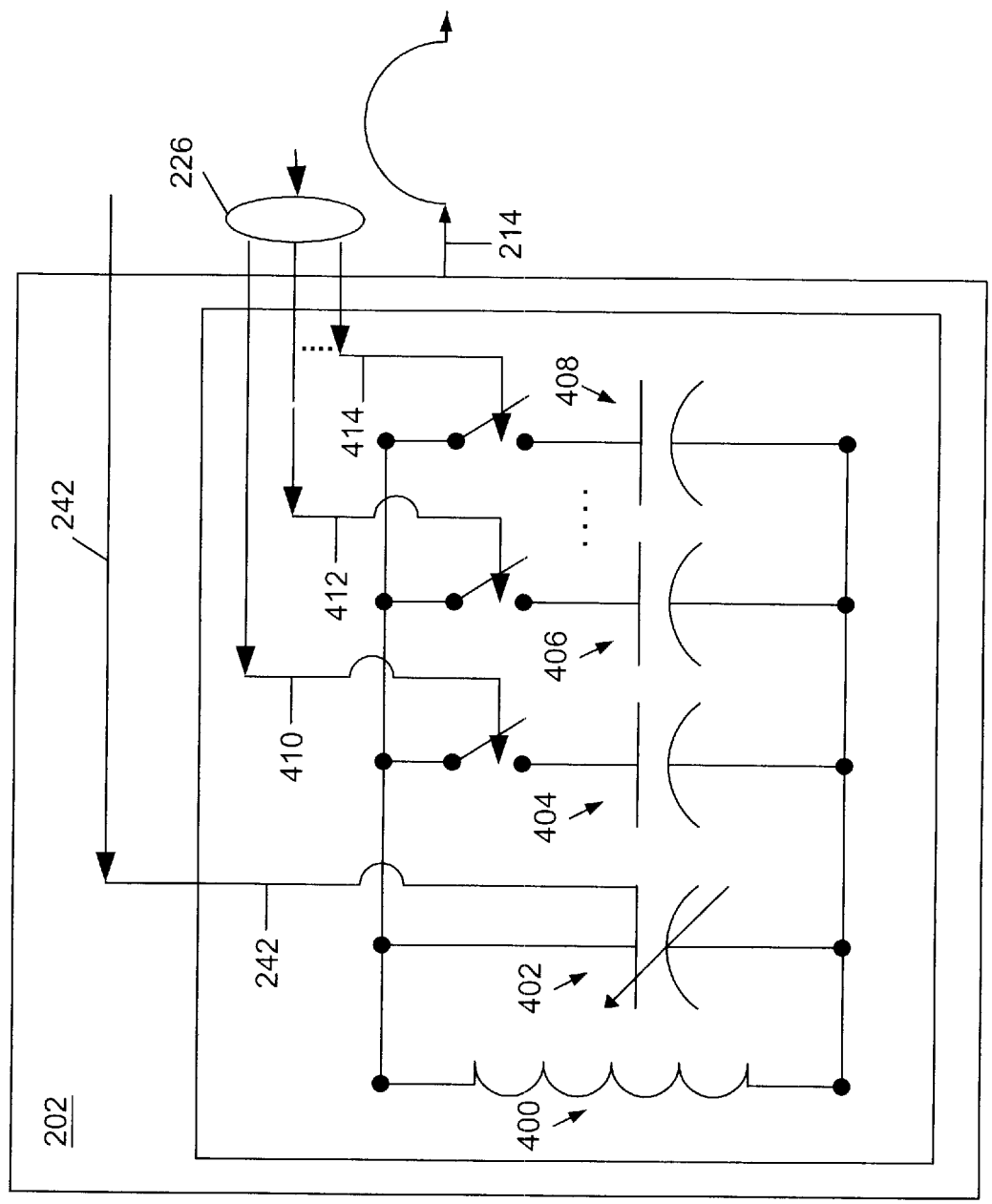
FIG. 4 is a block diagram of one of a number of embodiments of the controllable oscillator of FIG. 2 for implementing the plurality of operational states and corresponding distinct frequencies for the output signal, which are controlled by the frequency control circuit of FIG. 2.

FIG. 4 illustrates a block diagram of one of a number of embodiments of controllable oscillator 202 for implementing the plurality of operational states and corresponding distinct frequencies for the output signal, which are controlled by frequency control circuit 208. Controllable oscillator 202 may comprise an inductor 400, a variable capacitor 402, and switched capacitors 404, 406, and 408. Inductor 400, variable capacitor 402, and switched capacitors 404, 406, and 408 may be connected in parallel as shown in FIG. 4. However, as known by one of ordinary skill in the art, there are various other configurations for inductor 400, variable capacitor 402, and switched capacitors 404, 406, and 408. For example, inductor 400, variable capacitor 402, and switched capacitors 404, 406, and 408 may be connected in series or may be connected in any of a number of combinations of parallel and series connections. Furthermore, one of ordinary skill in the art should also know that there are numerous other ways of configuring controllable oscillator 202 in order to implement the plurality of operational states. As stated above, the important aspects of frequency synthesizer 112 are that controllable oscillator 202 is configured to have a plurality of operational states in which each of the operational states correspond to a distinct frequency for the output signal of controllable oscillator 202 and that the operational state of controllable oscillator 202 is responsive to control signals received from phase-locked loop 206 and frequency control circuit 208.

Switched capacitors 404, 406, and 408 receive the control signal from to frequency control circuit 208 on connection 226. In response to the control signal from frequency control circuit 208, switched capacitors 404, 406, and 408 are engaged or disengaged in a predetermined manner corresponding to one of the operational states. In one of numerous embodiments of frequency synthesizer 112, the number of switched capacitors defines the number of operational states and corresponding frequencies for the output signal of controllable oscillator 202. For instance, if there are three switched capacitors, controllable oscillator 202 may have eight ($2^3$=8) operational states. Because each of the switched capacitors may be engaged or disengaged, there are eight possible binary configurations for the switched capacitors, with each configuration producing a distinct frequency for the output signal of controllable oscillator 202. As shown in Equations 1 and 2, each distinct frequency for the output signal of controllable oscillator 202 may be defined as a function of the component values for inductor 400 (L), variable capacitor 402 ($C_{var}$), and switched capacitors 404 ($C_0$), 406 ($C_1$), and 408 ($C_n$) and binary weighting coefficients $b_0$, $b_1$ and $b_n$, where $f_{co}$ is the frequency of the output signal of controllable oscillator 202:

$$f_{co} \alpha \frac{1}{\sqrt{LC}} \qquad \text{(Equation 1)}$$

$$C = C_{var} + b_0 C_0 + b_1 C_1 + \ldots + b_n C_n \qquad \text{(Equation 2)}$$

In Equation 2, switched capacitors 404, 406, and 408 are binary weighted. For example, in a 3-bit digital system, switched capacitors 404, 406, and 408 may be weighted as follows: $C_0$=C, $C_1$=2C, and $C_n$=8C.

The number of switched capacitors also defines the number of control lines required between frequency control circuit 208 and controllable oscillator 202. For example, if there are three switched capacitors to be engaged or disengaged, frequency control circuit 208 may use three control lines (one control line for each switched capacitor). For example, referring to FIGS. 3 and 4, at block 304, frequency circuit 208 may determine that for a 3-bit system the frequency of the output signal of controllable oscillator 202 best approximates the predefined frequency where switched capacitor 404 is engaged, switched capacitor 406 is disengaged, and switched capacitor 408 is engaged. Accordingly, at block 306, frequency control circuit 208 may generate three control signals. A first control signal 410 corresponding to switched capacitor 404 may be configured to engage switched capacitor 404. A second control signal 412 corresponding to switched capacitor 406 may be configured to disengage switched capacitor 406. A third control signal 414 corresponding to switched capacitor 408 may be configured to engage switched capacitor 408. In response to these control signals, at block 308, switched capacitors 404, 406, and 408 are engaged, disengaged, and engaged, respectively. This configuration changes controllable oscillator 202 to the operational state corresponding to the distinct frequency that best approximates the predefined frequency.

In those embodiments where controllable oscillator 202 is also controlled by phase-locked loop 206, controllable oscillator 202 may be further controlled by varying the control signal applied to variable capacitor 402 on connection 242.

Figure 5:
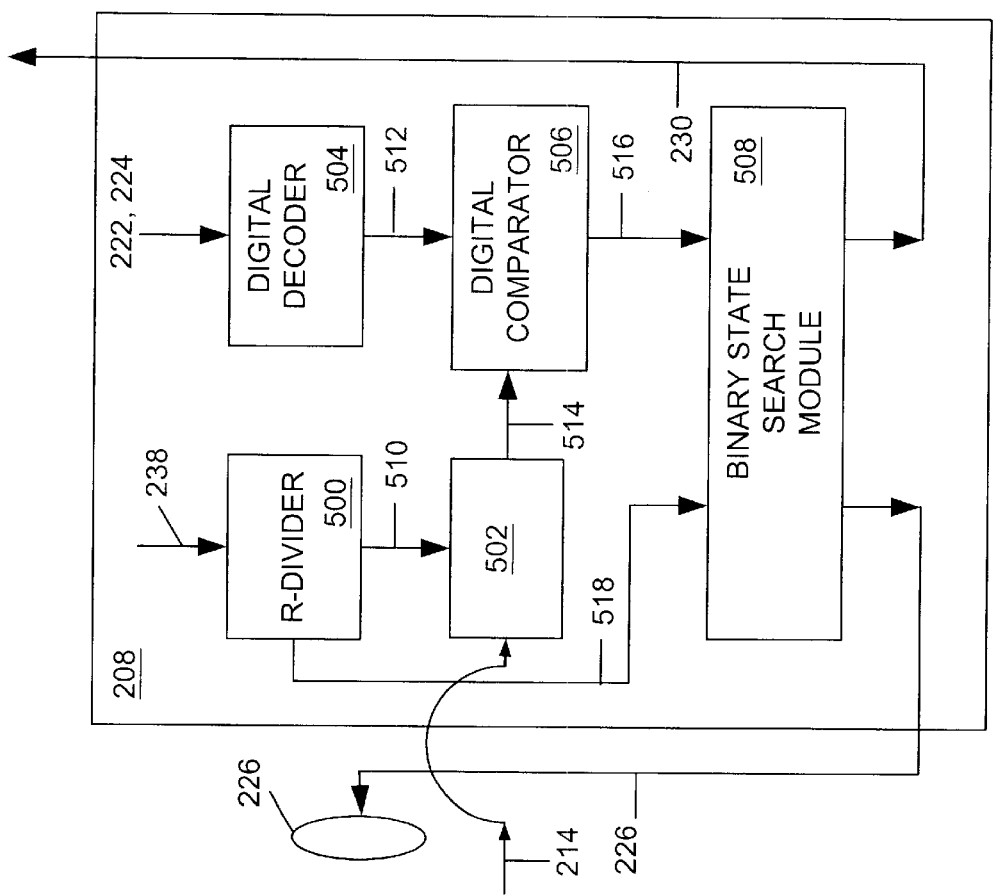
FIG. 5 is a block diagram of one of a number of embodiments of the frequency control circuit of FIG. 2 for controlling the frequency of the output signal of the controllable oscillator.

FIG. 5 illustrates a block diagram of one of a number of embodiments of frequency control circuit 208 for controlling the frequency of the output signal of controllable oscillator 202. Frequency control circuit 208 may comprise a program counter, or R-divider, 500, a frequency detector, or counter, 502, a digital decoder 504, a digital comparator 506, and a binary state search module 508.

Figure 6:
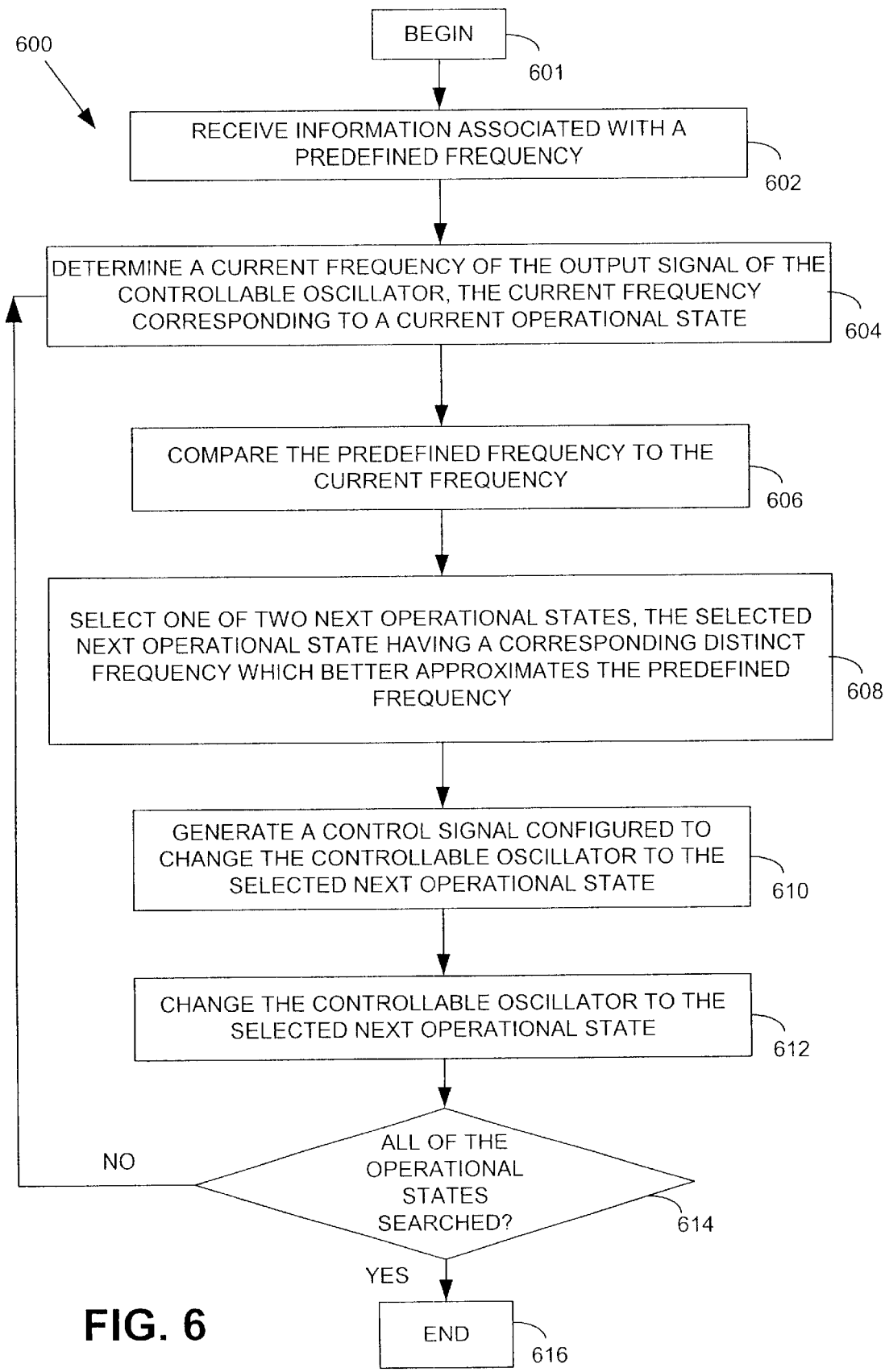
FIG. 6 is a flow chart illustrating the architecture and operation of the frequency control circuit of FIG. 5.

FIG. 6 is a flow chart 600 illustrating the architecture and operation of frequency control circuit 208 of FIG. 5. At block 601, frequency control circuit 208 is enabled. At block 602, digital decoder 504 receives information associated with a predefined frequency for the output signal of controllable oscillator 202 on connections 222 and 224 from serial port 212 (FIG. 2). At block 604, frequency detector 502 determines a current frequency of the output signal of controllable oscillator 202, which corresponds to the current operational state of controllable oscillator 202. Frequency detector 502 receives a timing signal on connection 510 from program counter 500. Program counter 500 generates the timing signal based on the reference frequency received on connection 238 (FIG. 2). The timing signal may be used to clock the operation of frequency detector 502 and binary state search module 508. Frequency detector 502 receives the output signal of controllable oscillator 202 on connection 214 (FIG. 2). In response to a clock pulse, frequency detector 502 generates a first digital word corresponding to the current frequency of the output signal.

At block 606, digital comparator 506 compares the first digital word to a second digital word received on connection 512 from digital decoder 504 and provides a control bit on connection 516 to binary state search module 508. For example, digital comparator 506 may be configured to generate a logic 1 for the control bit when the first digital word is higher than the second digital word and a logic 0 for the control bit when the second digital word is higher than the first digital word. Based on the control bit, the current operational state of controllable oscillator 202, and the timing signal received on connection 518, at block 608, binary state search module 508 selects a next operational state for controllable oscillator 202. As described in detail below, frequency control circuit 208 is configured so that the next operational state has a corresponding distinct frequency that better approximates the predefined frequency for the output signal of controllable oscillator 202. At block 610, binary state search module 508 generates a control signal configured to change controllable oscillator 202 to the selected next operational state. At block 612, controllable oscillator 202 is changed to the selected next operational state. At block 614, binary state search module 508 determines whether all of the operational states of controllable oscillator 202 have been searched. If all of the operational states have been searched, frequency control circuit 208 is disabled. If all of the operational states have not been searched, blocks 604, 606, 608, 610, 612, and 614 are repeated.

Figure 7:
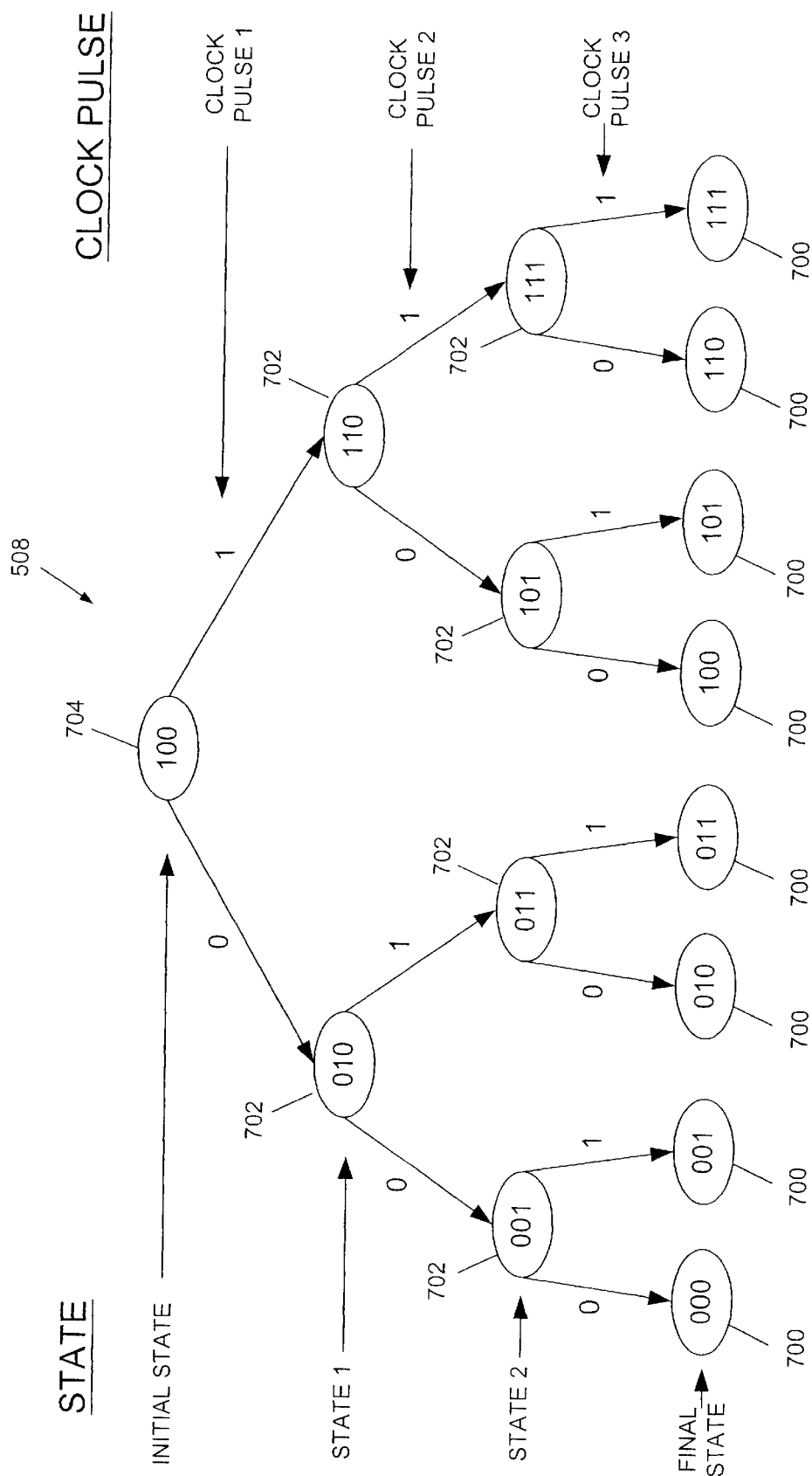
FIG. 7 is a binary state diagram of the binary state search module of FIGS. 5 and 6.

FIG. 7 is a tree state diagram of binary state search module 508 of FIG. 5. The binary tree comprises leaf nodes 700, intermediate nodes 702, and root node 704. Root node 704 represents the initial binary state that corresponds to the initial operational state of controllable oscillator 202 prior to the operation of frequency control circuit 208. Intermediate nodes 702 represent the set of intermediate binary states corresponding to the possible operational states that controllable oscillator 202 may occupy during the operation of frequency control circuit 208. Leaf nodes 700 designate the final binary states corresponding to the plurality of operational states of controllable oscillator 202.

As stated above, binary state search module 508 may use the binary tree to search the plurality of operational states of controllable oscillator 202 and determine which distinct frequency best approximates the predefined frequency. For instance, in the 3-bit system of FIG. 7, controllable oscillator 202 may be configured to have eight ($2^3=8$) operational states. Accordingly, the binary tree may also have eight leaf nodes 700. Before frequency control circuit 208 is enabled, binary state search module 508 is at root node 704, which represents the initial operational state (100 in the example of FIG. 7) of controllable oscillator 202. As described above, frequency control circuit 208 determines the current frequency of the output signal while controllable oscillator 202 is in the initial operational state (100 in the example of FIG. 7). Frequency control circuit 208 then compares the current frequency to the predefined frequency. Based on the comparison of the current frequency and the predefined frequency and in response to a clock pulse, binary state search module 508 selects one of the two intermediate nodes 702 linked to root node 704. The two intermediate nodes 702 linked to root node 704 represent the two next operational states (010, 110 in the example of FIG. 7) for controllable oscillator 202. Binary state search module 508 may be configured so that the two next operational states for root node 704 and intermediate nodes 702 are defined by the following equation, where $M_{new}$ represents the next operational state and M represents the current operational state:

$$M_{new}=M\pm M/2 \qquad \text{(Equation 3)}$$

For example, in FIG. 7, the initial operational state may be represented in binary as 100, which corresponds to decimal 6. Based on Equation 3, the binary tree is configured so that the two next operational states are represented in binary as 010 and 110, which correspond to decimal 4 and 6, respectively. In this manner, in N clock pulses, binary state search module 508 may search through $2^N$ operational states to determine the operational state having the distinct frequency that best approximates the predefined frequency.

It should be understood by one of ordinary skill in the art that there are numerous ways of implementing the binary tree illustrated in FIG. 7. The particular value (binary or decimal) associated with each of the binary states in the binary tree may be configured in a number of ways for each embodiment. For example, in the exemplar binary tree of FIG. 7, the initial operational state is represented in binary as 100 and the two next operational states are represented in binary as 010 and 110. Binary state search module 508 may be configured to implement a binary tree having any values associated with each of the binary states in the binary tree.

After comparing the current frequency and the predefined frequency, binary state search module 508 selects the next operational state that has a distinct frequency that better approximates the predefined frequency. Frequency control circuit 208 then generates a control signal configured to change controllable oscillator 202 to the selected next operational state. After controllable oscillator 202 is changed to the selected next operational state, frequency control circuit 208 determines the frequency of the output signal of controllable oscillator 202 corresponding to the selected next operational state. This process is repeated for all states in the binary tree until binary state search module 508 selects a next operational state for controllable oscillator 202 corresponding to one of the leaf nodes 700. The leaf node 700 selected by binary state search module 508 represents the operational state having the distinct frequency that best approximates the predefined frequency.

Amplitude Control Circuit

Figure 8:
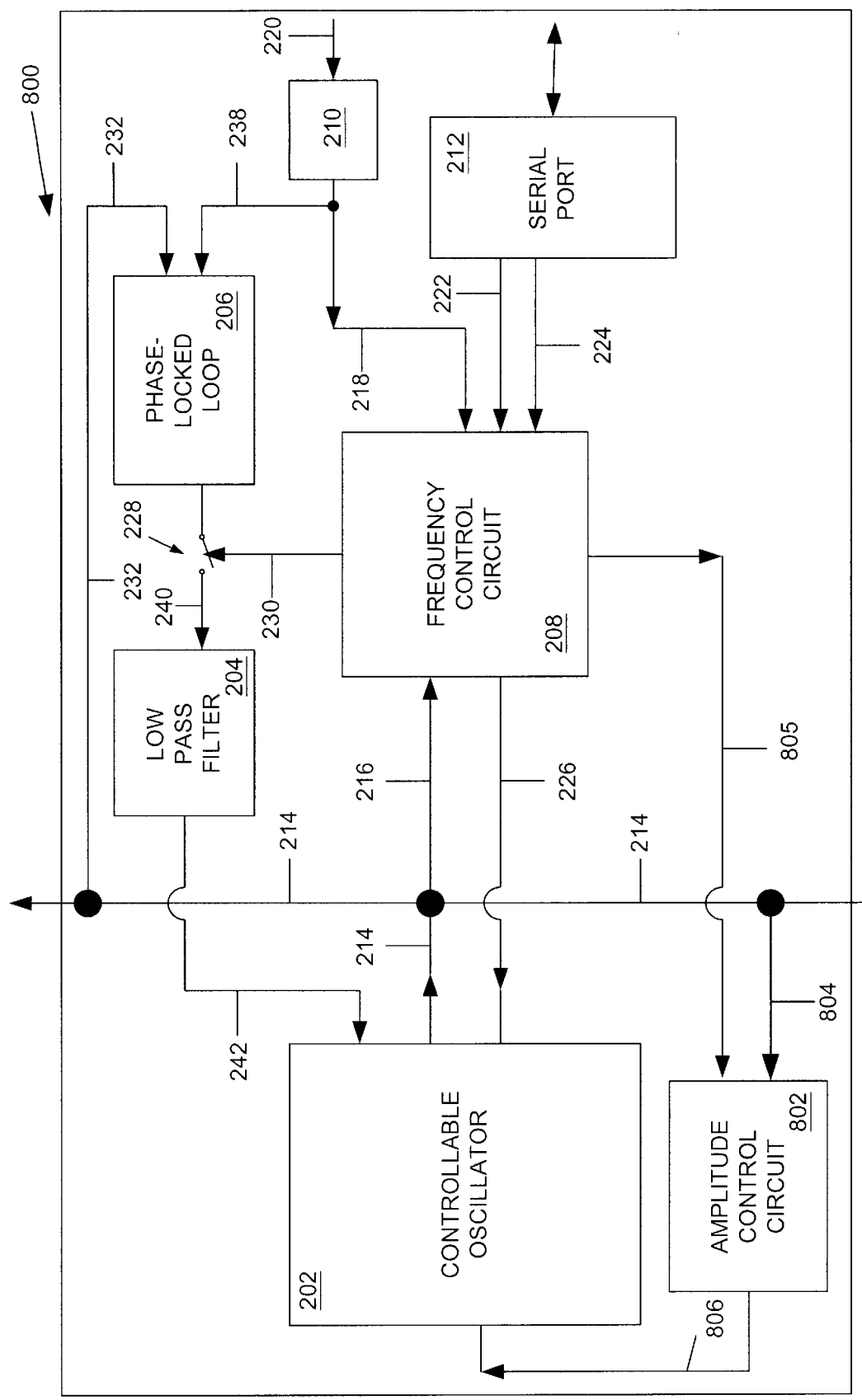
FIG. 8 is a block diagram of another of a number of embodiments of the frequency synthesizer of FIG. 1.

FIG. 8 illustrates a block diagram of another of a number of embodiments of the frequency synthesizer of FIG. 1. Frequency synthesizer 800 comprises a controllable oscillator 202, a low pass filter 204, a phase-locked loop 206, a frequency control circuit 208, an R-divider circuit 210, a serial port 212, and an amplitude control circuit 802.

Frequency synthesizer 800 may be implemented in hardware, software, firmware, or a combination thereof. In certain embodiments, frequency synthesizer 800 may be implemented in software or firmware that is stored in memory and that is executed by a processor or any other suitable instruction execution system. Where implemented in hardware, as in certain other embodiments, frequency synthesizer 800 may be implemented with any or a combination of the following technologies, which are all well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

In general, frequency synthesizer 800 is configured and operates in a similar manner to frequency synthesizer 112 of FIG. 2. However, it should be understood by those of ordinary skill in the art that frequency synthesizer 800 need not include frequency control circuit 208. The important aspect of frequency synthesizer 800 is that amplitude control circuit 802 communicates with controllable oscillator 202, and as the frequency of the output signal of the controllable oscillator is controlled, such as, for example, by phase-locked loop 206 and/or frequency control circuit 208, amplitude control circuit 802 maintains the amplitude of the output signal.

Due to complex interactions between the amplitude and frequency of the output signal of controllable oscillator 202, it is desirable to maintain a constant amplitude for the output signal of controllable oscillator 202 over the entire frequency range. Therefore, as the frequency of the output signal of controllable oscillator 202 is changed, such as, for example, by phase-locked loop 206 and/or frequency control circuit 208, amplitude control circuit 802 may be enabled.

As described above with respect to FIG. 2, controllable oscillator 202 may be configured to have a plurality of operational states in which each of the operational states corresponds to a distinct frequency for the output signal of controllable oscillator 202. The frequency of the output signal of controllable oscillator 202 may be controlled by changing the operational state of controllable oscillator 202 and thereby changing the corresponding distinct frequency for the output signal.

Where amplitude control circuit 802 is employed, controllable oscillator 202 may be further configured to have a plurality of operational states in which each of the operational states corresponds to a distinct amplitude for the output signal of controllable oscillator 202. The amplitude of the output signal of controllable oscillator 202 may be maintained throughout the frequency range by changing the operational state of controllable oscillator 202 and thereby changing the corresponding amplitude for the output signal.

Figure 9:
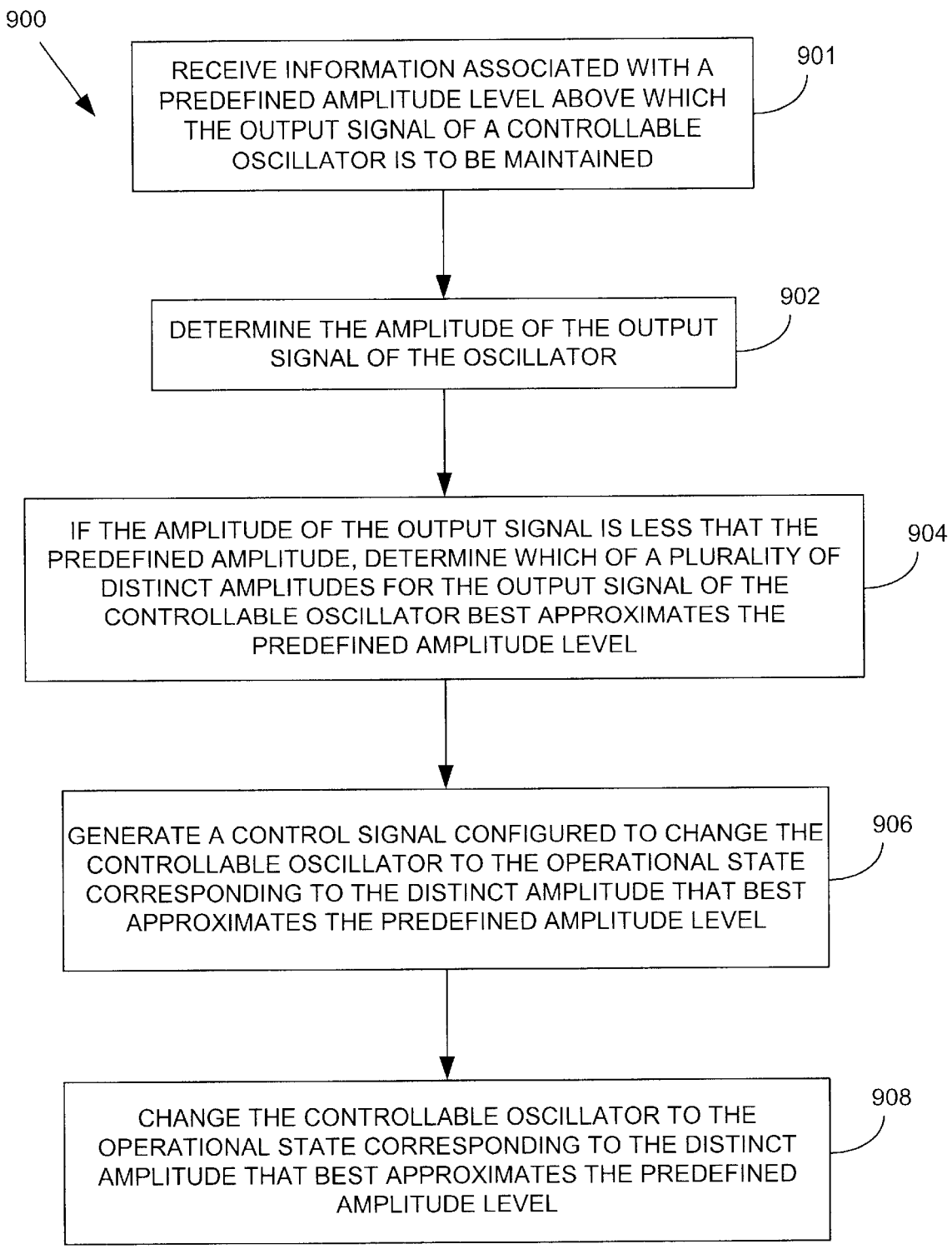
FIG. 9 is a flow chart illustrating the architecture and operation of one of a number of embodiments of the amplitude control circuit of FIG. 8 for maintaining the amplitude of the output signal of the controllable oscillator.

FIG. 9 is a flow chart 900 illustrating the architecture and operation of one of a number of embodiments of amplitude control circuit 802 of FIG. 8. At block 901, amplitude control circuit 802 receives information associated with a predefined amplitude level for the output signal of controllable oscillator 202. The information may define a minimum amplitude level above which the amplitude of the output signal of controllable oscillator 202 should be maintained. The information may also be represented as an amplitude range in which the amplitude of the output signal should be maintained. The important aspect of amplitude control circuit 802 is that it receives information for maintaining or controlling the amplitude level of the output signal of controllable oscillator 202. The information associated with the predefined amplitude level may be received from serial port 212 or any other component not shown in FIG. 8. The information may even be contained in memory within amplitude control circuit 802. At block 902, amplitude control circuit 802 determines the amplitude of the output signal of controllable oscillator 202. At block 904, amplitude control circuit 802 compares the amplitude to the predefined amplitude level and determines whether the amplitude of the output signal needs to be changed. For example, if the amplitude of the output signal is less than the predefined amplitude level, amplitude control circuit 802 may determine which of the plurality of operational states has a distinct amplitude for the output signal that best approximates the predefined amplitude level. At block 906, amplitude control circuit 802 generates a control signal configured to change controllable oscillator 202 to the operational state corresponding to the distinct amplitude that best approximates the predefined amplitude level. At block 908, in response to the control signal from amplitude control circuit 802, controllable oscillator 202 may be changed to the operational state corresponding to the distinct amplitude that best approximates the predefined amplitude level.

It should be understood by those of ordinary skill in the art that there are various embodiments of frequency synthesizer 800. For example, the important aspect is that amplitude control circuit 802 communicates with controllable oscillator 202, and as the frequency of the output signal of the controllable oscillator is controlled, such as, for example, by phase-locked loop 206 and/or frequency control circuit 208, amplitude control circuit 802 maintains the amplitude of the output signal in a predetermined manner. Therefore, in some embodiments of frequency synthesizer 800, amplitude control circuit 802 may operate in conjunction with frequency control circuit 208. For instance, every time frequency control circuit 208 changes the frequency of the output signal of controllable oscillator 202, amplitude control circuit 802 may be enabled to adjust the amplitude of the output signal. This interaction between frequency control circuit 208 and amplitude control circuit 802 may be controlled by timing signals communicated via connection 805 (FIG. 8). In other embodiments of frequency synthesizer 800, there may be no frequency control circuit 208, in which case amplitude control circuit 802 responds to frequency changes produced by phase-locked loop 206.

Figure 10:
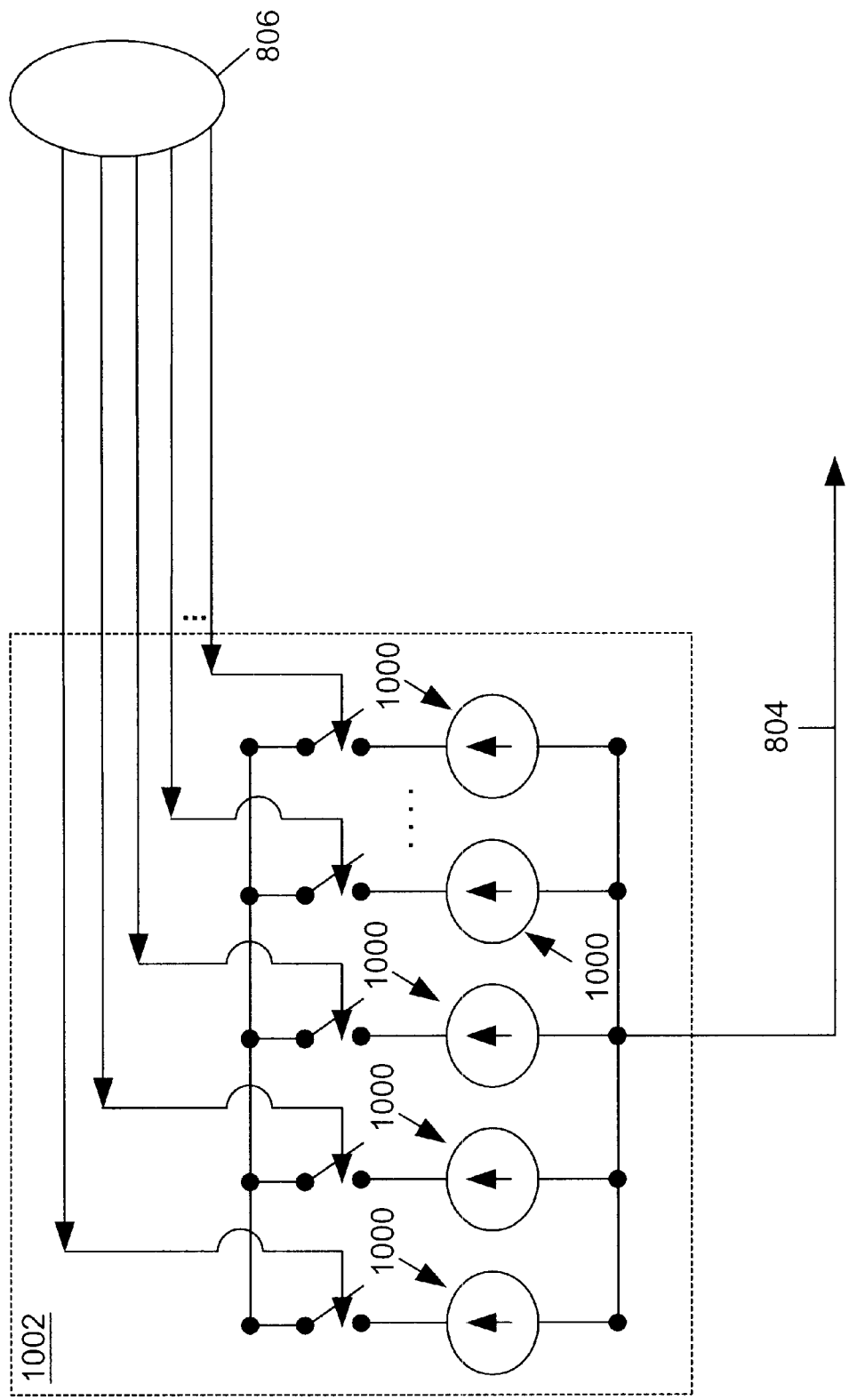
FIG. 10 is a block diagram of one of a number of embodiments of the controllable oscillator of FIG. 8 for implementing the plurality of operational states and corresponding distinct amplitudes for the output signal, which are controlled by the amplitude control circuit of FIG. 8.

FIG. 10 illustrates a block diagram of one of a number of embodiments of a controllable oscillator 1002 for implementing the plurality of operational states and corresponding distinct amplitudes for the output signal, which are controlled by amplitude control circuit 802. Controllable oscillator 1002 may comprise a plurality of switched current sources 1000 connected in parallel. Switched current sources 1000 receive the control signal from amplitude control circuit 802 on connection 806. In response to the control signal, switched current sources 1000 are engaged or disengaged in a predetermined manner corresponding to one of the operational states of controllable oscillator 1002. In one of numerous embodiments of frequency synthesizer 800, the number of switched current sources 1000 defines the number of operational states and corresponding amplitudes for the output signal of controllable oscillator 1002. For instance, if there are three switched current sources 1000, controllable oscillator 1002 may have eight ($2^3=8$) operational states. Because each of the switched current sources 1000 may be engaged or disengaged, there are eight possible configurations for the switched current sources 1000, with each configuration producing a distinct amplitude for the output signal of controllable oscillator 1002.

The number of switched current sources 1000 also defines the number of control lines required for amplitude control circuit 802 to control controllable oscillator 1002. For example, if there are three switched current sources 1000 to be engaged or disengaged, amplitude control circuit 802 may use three control (one control line for each switched current source 1000). Amplitude control circuit 802 controls the operational state of controllable oscillator 1002 in the same manner as described above with respect to frequency control circuit 208.

Figure 11:
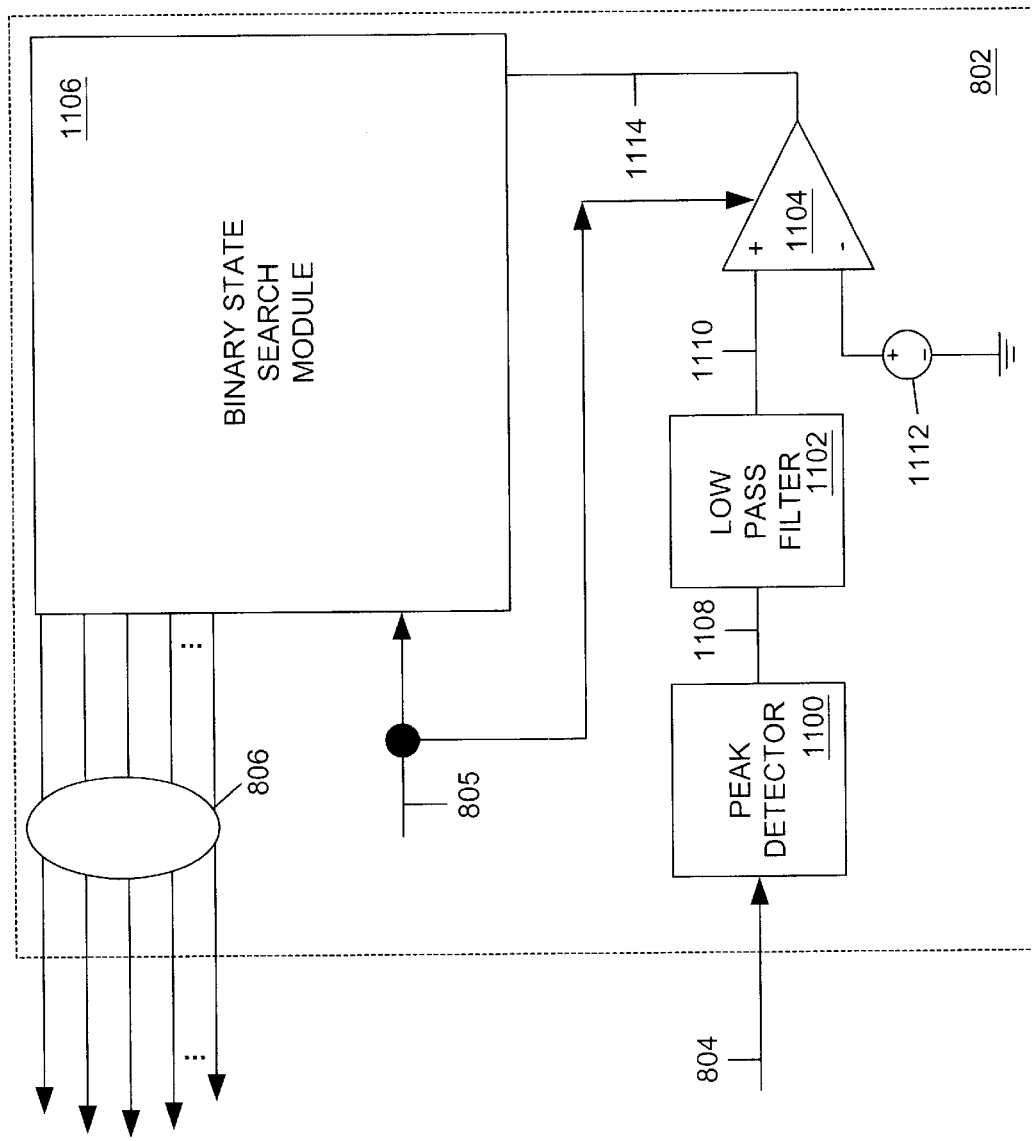
FIG. 11 illustrates a block diagram of one of a number of embodiments of the amplitude control circuit of FIG. 8 for maintaining the amplitude of the output signal of the controllable oscillator of FIG. 8.

FIG. 11 illustrates a block diagram of one of a number of embodiments of amplitude control circuit 802 for maintaining the amplitude of the output signal of controllable oscillator 1002. Amplitude control circuit 802 may comprise peak detector 1100, low pass filter 1102, amplifier 1104, and binary state search module 1106.

In the operation of amplitude control circuit 802, peak detector 1100 receives the output signal of controllable oscillator 1002 on connection 804. Peak detector 1100 determines the amplitude of the output signal and provides the information on connection 1108 to low pass filter 1102 where the signal is filtered. The filtered signal is provided on connection 1110 to amplifier 1104. Amplifier 1104 compares the information associated with the amplitude of the output signal of controllable oscillator 202 to a reference voltage 1112 and provides a control bit on connection 1114 to binary state search module 1106. For example, amplifier 1104 may be configured to generate a logic 1 for the control bit when the amplitude of the output signal of controllable oscillator 202 is higher than the reference voltage and a logic 0 for the control bit when the reference voltage is higher than the amplitude of the output signal. Where amplitude control circuit 802 operates in conjunction with frequency control circuit 208, amplifier 1104 may be connected to, and controlled by, frequency control signal 208 via connection 805. Referring again to FIG. 7, binary state search module 1106 functions the same way as described above with respect to binary state search module 508. Again, where amplitude control circuit 802 operates in conjunction with frequency control circuit 208, binary state search module 1106 may be connected to, and controlled by, frequency control signal 208 via connection 805.

Any process descriptions or blocks in FIGS. 3, 6, and 9 should be understood as representing modules, segments, or portions of code which include one or more executable instructions for implementing specific logical functions or steps in the process, and alternate implementations are included within the scope of the preferred embodiment of the present invention in which functions may be executed out of order from that shown or discussed, including substantially concurrently or in reverse order, depending on the functionality involved, as would be understood by those reasonably skilled in the art.

In addition, frequency synthesizers 112 and 800, frequency control circuit 208, and amplitude control circuit 802, which may comprise an ordered listing of executable instructions for implementing logical functions, can be embodied in any computer readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM or Flash memory) (electronic), an optical fiber (optical), and a portable compact disc read-only memory (CDROM) (optical). Note that the computer readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

While various embodiments of the invention have been described, it will be apparent to those of ordinary skill in the art that many more embodiments and implementations are possible that are within the scope of this invention.

What is claimed is:

1. A circuit for maintaining the amplitude of an output signal of a controllable oscillator, comprising:
   a controllable oscillator configured to venerate an output signal having a predefined frequency and a predefined amplitude, the controllable oscillator having a plurality of operational states responsive to a plurality of control signals, each of the plurality of operational states corresponding to a particular current bias associated with a distinct amplitude of the output signal of the controllable oscillator; and
   an amplitude control circuit in communication with the controllable oscillator, the control circuit configured to determine the amplitude of the output signal of the controllable oscillator and, when the amplitude of the output signal of the controllable oscillator is less than the predefined amplitude, provide the plurality of control signals to the controllable oscillator, the plurality of control signals configured to change the controllable oscillator to the operational state corresponding to the distinct amplitude that best approximates the predefined amplitude.

2. The circuit of claim 1, wherein the amplitude control circuit comprises:
   a peak detector configured to determine each of the plurality of distinct amplitudes for the output signal corresponding to the plurality of operational states;
   a comparator configured to compare each of the plurality of distinct amplitudes for the output signal corresponding to the plurality of operational states to the predefined amplitude; and
   logic configured to determine which of the plurality of distinct amplitudes for the output signal corresponding to the plurality of operational states best approximates the predefined amplitude.

3. The circuit of claim 1, wherein the controllable oscillator comprises a plurality of current sources capable of being engaged by the plurality of control signals, the plurality of current sources defining the plurality of operational states of the controllable oscillator.

4. The circuit of claim 1, wherein the logic implements a binary search algorithm to determine the distinct amplitude for the output signal corresponding to the plurality of operational states that best approximates the predefined amplitude.

5. The circuit of claim 1, wherein the amplitude control circuit comprises:
   a program counter configured to generate a timing signal based on the predefined frequency, the timing signal having a plurality of clock pulses;
   a peak detector configured to generate a first digital word corresponding to the current amplitude of the output signal of the oscillator;
   a digital comparator configured to compare the first digital word to a second digital word associated with the predefined amplitude; and
   logic configured to receive the timing signal and, in response to each of the plurality of clock pulses, to generate the plurality of control signals based on the comparison of the first digital word to the second digital word.

6. A communication device for use in a communication system, comprising:

a transceiver configured to communicate with the communication system via a communication channel at a particular frequency; and a frequency synthesizer configured to select the communication channel, the frequency synthesizer comprising:

a controllable oscillator configured to generate an output signal having a predefined frequency corresponding to the particular frequency and a predefined amplitude, the controllable oscillator having a plurality of operational states responsive to a plurality of control signals, each of the plurality of operational states defining a distinct amplitude for the output signal of the controllable oscillator; and an amplitude control circuit in communication with the controllable oscillator, the amplitude control circuit configured to determine the distinct amplitude for the output signal that best approximates the predefined amplitude and to provide the plurality of control signals, the plurality of control signals configured to change the controllable oscillator to the operational state corresponding to the distinct amplitude that best approximates the predefined amplitude.

7. A method for maintaining the amplitude of an output signal of a controllable oscillator at a predefined amplitude level, the controllable oscillator having a plurality of operational states, each of the plurality of operational states corresponding to a particular current bias and defining a distinct amplitude for the output signal of the controllable oscillator, comprising:

determining the amplitude of the output signal of the controllable oscillator;

if the amplitude of the output signal is less than the predefined amplitude level, determining the distinct amplitude for the output signal of the controllable oscillator that best approximates the predefined amplitude level; and generating a control signal configured to change the controllable oscillator to the operational state corresponding to the distinct amplitude that best approximates the predefined amplitude level.

8. The method of claim 7, wherein the determining which of the distinct amplitudes for the output signal of the controllable oscillator best approximates the predefined amplitude level involves a binary search algorithm.

9. The method of claim 8, further comprising changing the controllable oscillator to the operational state corresponding to the distinct amplitude that best approximates the predefined amplitude level.

10. The method of claim 9, wherein the changing the controllable oscillator to the operational state corresponding to the distinct amplitude that best approximates the predefined amplitude level involves configuring a plurality of current sources in a predetermined manner.

11. A method for maintaining the amplitude of an output signal of a controllable oscillator at a predefined amplitude level, the controllable oscillator having a plurality of operational states, each of the plurality of operational states corresponding to a particular current bias and defining a distinct amplitude for the output signal of the controllable oscillator, comprising:

determining the current amplitude of the output signal of the controllable oscillator, the current amplitude corresponding to a current operational state;

comparing the predefined amplitude level to the current amplitude; and if the current amplitude is less than the predefined amplitude level, based on the comparing the predefined amplitude level to the current amplitude, selecting one of two next operational states, the selected next operational state having a distinct amplitude that better approximates the predefined amplitude level.

12. The method of claim 11, further comprising generating a control signal configured to change the controllable oscillator to the selected next operational state.

13. The method of claim 12, further comprising changing the controllable oscillator to the selected next operational state.

14. The method of claim 13, wherein the changing the controllable oscillator to the selected next operational state involves configuring a plurality of current sources in a predetermined manner.

15. The method of claim 13, further comprising repeating the determining the current amplitude of the output signal of the controllable oscillator, the comparing the predefined amplitude level to the current amplitude, the selecting one of two next operational states, the generating a control signal configured to change the controllable oscillator to the selected next operational state, and the changing the controllable oscillator to the selected next operational state.

16. A system for maintaining the amplitude of an output signal of a controllable oscillator at a predefined amplitude level, the controllable oscillator having a plurality of operational states, each of the plurality of operational states corresponding to a particular current bias and defining a distinct amplitude for the output signal of the controllable oscillator, the method comprising:

means for determining the amplitude of the output signal of the controllable oscillator;

means for determining, when the amplitude of the output signal is less than the predefined amplitude level, the distinct amplitude for the output signal of the controllable oscillator that best approximates the predefined amplitude level; and means for generating a control signal configured to change the controllable oscillator to the operational state corresponding to the distinct amplitude that best approximates the predefined amplitude level.

17. The system of claim 16, wherein the means for determining the distinct amplitude for the output signal of the controllable oscillator that best approximates the predefined amplitude level involves a binary search algorithm.

18. The system of claim 17, further comprising means for changing the controllable oscillator to the operational state corresponding to the distinct amplitude that best approximates the predefined amplitude level.

19. The method of claim 18, wherein the means for changing the controllable oscillator to the operational state corresponding to the distinct amplitude that best approximates the predefined amplitude level comprises a plurality of current sources configured in a predetermined manner.

20. A system for maintaining the amplitude of an output signal of a controllable oscillator at a predefined amplitude level, the controllable oscillator having a plurality of operational states, each of the plurality of operational states corresponding to a particular current bias and defining a distinct amplitude for the output signal of the controllable oscillator, comprising:

means for determining the current amplitude of the output signal of the controllable oscillator, the current amplitude corresponding to a current operational state;

means for comparing the predefined amplitude level to the current amplitude; and means for selecting, when the current amplitude is less than the predefined amplitude level, one of two next operational states based on the comparing the predefined amplitude level to the current amplitude, the selected next operational state having a distinct amplitude which better approximates the predefined amplitude level.

21. The system of claim 20, further comprising means for generating a control signal configured to change the controllable oscillator to the selected next operational state.

22. The system of claim 21, further comprising means for changing the controllable oscillator to the selected next operational state.

23. The system of claim 22, wherein the means for changing the controllable oscillator to the selected next operational state comprises a plurality of current sources configured in a predetermined manner.

24. The system of claim 23, further configured to repeat the determining the current amplitude of the output signal of the controllable oscillator, the comparing the predefined amplitude level to the current amplitude, the selecting one of two next operational states, the generating a control signal configured to change the controllable oscillator to the selected next operational state, and the changing the controllable oscillator to the selected next operational state.

25. A computer readable medium for maintaining the amplitude of an output signal of a controllable oscillator at a predefined amplitude level, the controllable oscillator having a plurality of operational states, each of the plurality of operational states corresponding to a particular current bias and defining a distinct amplitude for the output signal of the controllable oscillator, the computer readable medium comprising logic configured to determine the amplitude of the output signal of the controllable oscillator, to determine, when the amplitude of the output signal is less than the predefined amplitude level, the distinct amplitude for the output signal of the controllable oscillator that best approximates the predefined amplitude level, and to generate a control signal configured to change the controllable oscillator to the operational state corresponding to the distinct amplitude that best approximates the predefined amplitude level.

26. The computer readable medium of claim 25, wherein the logic for determining the distinct amplitude for the output signal of the controllable oscillator that best approximates the predefined amplitude level involves a binary search algorithm.

27. The computer readable medium of claim 26, wherein the logic is further configured to change the controllable oscillator to the operational state corresponding to the distinct amplitude that best approximates the predefined amplitude level.

28. A computer readable medium for maintaining the amplitude of an output signal of a controllable oscillator at a predefined amplitude level, the controllable oscillator having a plurality of operational states, each of the plurality of operational states corresponding to a particular current bias and defining a distinct amplitude for the output signal of the controllable oscillator, the computer readable medium comprising logic configure to determine the current amplitude of the output signal of the controllable oscillator, the current amplitude corresponding to a current operational state, to compare the predefined amplitude level to the current amplitude, to select, if the current amplitude is less than the predefined amplitude level, one of two next operational states based on the comparing the predefined amplitude level to the current amplitude, the selected next operational state having a distinct amplitude which better approximates the predefined amplitude level.

29. The computer readable medium of claim 28, wherein the logic is further configured to generate a control signal configured to change the controllable oscillator to the selected next operational state.

30. The computer readable medium of claim 29, wherein the logic is further configured to change the controllable oscillator to the selected next operational state.

31. The computer readable medium of claim 30, wherein the logic is further configured to repeat the determining the current amplitude of the output signal of the controllable oscillator, the comparing the predefined amplitude level to the current amplitude, the selecting one of two next operational states, the generating a control signal configured to change the controllable oscillator to the selected next operational state, and the changing the controllable oscillator to the selected next operational state.

* * * * *

UNITED STATES PATENT AND TRADEMARK OFFICE
CERTIFICATE OF CORRECTION

PATENT NO.    : 6,483,391 B1                                              Page 1 of 1
DATED         : November 19, 2002
INVENTOR(S)   : Magoon et al.

It is certified that error appears in the above-identified patent and that said Letters Patent is hereby corrected as shown below:

Column 14,
Line 3, delete "venerate" and replace with -- generate --.

Column 18,
Line 16, delete "configure" and replace with -- configured --.

Signed and Sealed this

Eighth Day of April, 2003

JAMES E. ROGAN
*Director of the United States Patent and Trademark Office*